United States Patent [19]
Sekiya et al.

[11] 3,979,608
[45] Sept. 7, 1976

[54] SOLID STATE BINARY LOGIC SIGNAL SOURCE FOR ELECTRONIC TIMEPIECE OR THE LIKE

[75] Inventors: Fukuo Sekiya, Tokorozawa; Shigeru Morokawa, Higashiyamato, both of Japan

[73] Assignee: Citizen Watch Co., Ltd., Tokyo, Japan

[22] Filed: Nov. 11, 1975

[21] Appl. No.: 630,821

[30] Foreign Application Priority Data
Nov. 14, 1974 Japan.............................. 49-131257

[52] U.S. Cl............................ 307/247 A; 307/251; 307/296; 307/214; 307/215; 58/23 BA; 58/50 R
[51] Int. Cl.[2] ........................................ H03K 17/60
[58] Field of Search............ 307/247 A, 247 R, 296, 307/304, 214, 215, 251; 58/23 A, 23 BA, 50 R

[56] References Cited
UNITED STATES PATENTS

| | | |
|---|---|---|
| 3,795,823 | 3/1974 | Morgan et al. ................. 307/247 A |
| 3,823,550 | 7/1974 | Bergey ............................... 58/50 R |
| 3,917,960 | 11/1975 | Kane................................... 307/296 |

*Primary Examiner*—John S. Heyman
*Attorney, Agent, or Firm*—Frank J. Jordan

[57] ABSTRACT

A pulse generator provides a first and a second train of pulses, the triggering edges of the second pulses occurring within the inactive period of the first train pulses. The first train pulses are coupled to a reset terminal of an S-R flip-flop and to a control terminal of a solid state switching device to establish a low impedance conduction path during the inactive periods of the first train pulses between a voltage source via a normally open switch and a set terminal of the S-R flip-flop. The Q output of the flip-flop is connected to a data input terminal of a data type flip-flop (D flip-flop). The second train pulses are applied to a clock input terminal of the D flip-flop to trigger the same at the triggering edges thereof. An output pulse will be delivered at the Q output of the D flip-flop when the switch is closed.

8 Claims, 6 Drawing Figures

SOLID STATE BINARY LOGIC SIGNAL SOURCE FOR ELECTRONIC TIMEPIECE OR THE LIKE

The present invention relates to a solid state binary logic signal source for an electronic timepiece or the like to serve as a logic interface between the user and the timepiece circuitry or the like.

In the field of electronic wristwatches or desk calculators, low power consumption is of primary concern not only to conserve available energy, but also to miniaturize the size of circuitry required to perform necessary functions. A prior art circuit comprises a metal oxide semiconductor inverting amplifier having a high impedance input resistor connected between an input terminal thereof and a low voltage source. A switch is connected between the input terminal and a high voltage source. When the switch is closed, the high voltage is applied to the input terminal across the input resistor, and when the switch is open the low voltage is applied to the input terminal. The output voltage of the amplifier is the inverse of the input voltage, and is fed into an electronic device such as an electronic timepiece circuitry. The output of the amplifier may be utilized as a reset input to the electronic timepiece to stop the counting operation thereof or stop the movement of a seconds hand, to advance the hour, minute or second settings or other similar functions. However, the input resistor provides a current passage between the high and low voltage sources while the switch is closed and thus dissipates heat. As a result, the input resistor has heretofore been mounted outside of the integrated circuitry which performs timekeeping functions. The outside mounting of the resistor creates a possibility of the resistor being adversely affected by the ambient humidity conditions and of the interconnection between the resistor and the integrated circuitry being subject to contact failure.

Another prior art circuit which overcomes such disadvantages comprises an inverting amplifier or NOT gate, a NOR gate having its one input connected to the output of the NOT gate and its output connected to the input of the NOT gate forming a memory loop. The input of the NOT gate is further connected to a high voltage source through a switch and its output is connected to the electronic timepiece circuitry. The other input of the NOR gate is supplied with reset pulses. When the switch is closed, the high voltage is connected to the NOT gate and a low voltage, the inverse of the input, is applied to the NOR gate. When the switch is open and a reset pulse is applied to the NOR gate, the output voltage of the NOT gate goes high. In this prior art circuit, however, a current will flow from the high voltage source to the NOR gate when the switch is closed and the reset pulse is applied, thus resulting in larger consumption of energy.

The primary object of the present invention is therefore to provide an improved solid state binary logic signal source for an electronic timepiece or the like which provides low power consumption and eliminates disadvantages encountered by the prior art circuitry.

The above and other objects, features and advantages of the present invention will become clear from the following detailed description taken with the accompanying drawings, in which.

Figure 1:
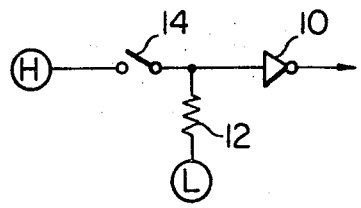
FIG. 1 is a schematic circuit diagram of a prior art circuit.

Referring now to FIG. 1, there is shown a first prior art logic signal source which comprises a complementary metal oxide semiconductor (CMOS) inverting amplifier 10, the input of which is connected through a high impedance input resistor 12 to a low voltage source L which constitutes a low logic voltage level. The input of the amplifier 10 is also connected through a switch 14 to a high voltage source H which constitutes a high logic voltage level. In operation, when the switch 14 is open the low voltage L is applied to the input of the amplifier 10 and a high voltage which is preferably of the potential H appears at the output of the amplifier 10. When the switch 14 is closed, the high voltage H is applied to the input of the amplifier 10 so that a low voltage which is preferably of the potential L appears at the output of the amplifier 10.

This prior art device suffers from the drawback that the resistor 12 must be located outside of the circuitry of the timepiece or the like because of the difficulty of using the integrated circuit technique in fabricating a resistive element having a high resistance on a semiconductor chip together with other circuit elements. This in turn gives rise to disadvantages in that the resistor 12 is likely to be adversely affected by the ambient conditions such as high relative humidity and that the connection between the resistor and the circuitry becomes a potential source of contact failure, and further that a substantial amount of power will be consumed by the resistor 12 when the switch 14 is closed.

Figure 2:
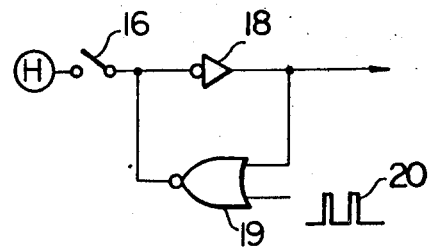
FIG. 2 is a schematic circuit diagram of another prior art circuit to which the present invention is an improvement.

Lower power consumption and integrated circuit fabrication requirements have resulted in a circuit which is shown as a second prior art logic signal source in FIG. 2. The circuit of FIG. 2 comprises a CMOS inverter or NOT gate 18, the input of which is connected through a switch 16 to the high voltage source H. The input of the NOT gate 18 is further connected to the output of a NOR gate 19. The output of the NOT gate 18 is connected to one input terminal of the NOR gate 19. The other input terminal of the NOR gate 19 is connected to a source of reset pulses 20. When the switch 16 is closed to couple the high voltage H to the NOT gate 18, a low level signal is coupled to the NOR gate 19 producing a high level signal at the output of the NOR gate 19 when the pulses 20 applied to the NOR gate 19 is at low level. This process will be continued while the switch 16 is closed. If the pulses 20 are applied to the NOR gate 19 when the switch 16 is open, the output of the NOR gate 19 goes low and the output of the NOT gate 18 goes high. It will be understood that the NOT gate 18 and the NOR gate 19 thus constitute a kind of set-reset type flip-flop circuit. However, there still remains a disadvantage in that while the switch 16 is closed the reset pulses 20 will trigger a current through the NOR gate 19. Thus, the passage of current to the high voltage source H will drain a substantial amount of energy which is a crucial problem in applications where the amount of available energy is very limited.

Figure 3:
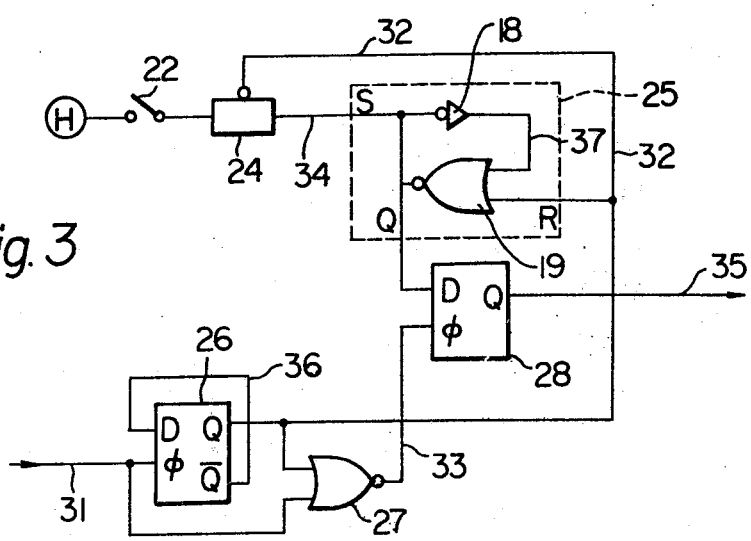
FIG. 3 is a schematic circuit diagram of an embodiment of the present invention.

The above-stated problems are overcome in the embodiment of the present invention shown in FIG. 3. A set-reset type flip-flop 25 identical to that shown in FIG. 2 is provided with a set input terminal S connected to the input of the NOT gate 18, a reset terminal R connected to the NOR gate 19 in the same manner as in FIG. 2, and an output terminal Q connected to the output of the NOR gate 19. The set input terminal of the flip-flop 25 is connected to a switch 22 through a solid state switch 24 which may be comprised of a P-channel enhancement mode MOS field-effect transistor. In this case, the set terminal of the flip-flop 25 is connected to the switch 22 via the drain-to-source path of the transistor 24 by way of lead 34 and the reset terminal R connected to the control gate of the transistor 24 by way of lead 32. A data-type flip-flop or D flip-flop 26 is provided. This flip-flop is a type of circuit which simply takes the value at its input when a clock pulse appears and remains in its same state until the next clock pulse appears. The $\phi$ input terminal which serves as a clock input terminal of the flip-flop 26 is connected to a source (not shown) of clock pulses by way of lead 31 and further connected to one input of a NOR gate 27. The D input terminal and the $\overline{Q}$ output terminal of the flip-flop 26 are connected together by lead 36, while the Q output terminal thereof is connected to the reset terminal of the flip-flop 25 and further to the other input of the NOR gate 27. The output of NOR gate 27 is in turn connected to the clock input terminal $\phi$ of a second D flip-flop 28 by way of lead 33. To the D input terminal of the flip-flop 28 is connected the Q output of the flip-flop 25.

The actual operation of the circuit of FIG. 3 will be explained in connection with FIG. 4. When a clock pulse is applied to the $\phi$ input of the flip-flop 26 on lead 31, the output frequency of the Q output will be one half the period of the clock pulse on lead 31 as shown in FIG. 4b. The signal at the Q output of the flip-flop 26 appears at one half the repetition frequency of input clock pulses on lead 31 and is applied to the reset terminal R of the flip-flop 25 and to the control gate of MOS-FET 24 by way of lead 32. Since the field effect transistor 24 is of a P-channel enhancement type, a conduction path will be established through its source to drain electrodes between the switch 22 and the set terminal of the flip-flop 25 when the control gate of transistor 24 is at the low level potential. Since the voltage at the input of NOT gate 18 is low while the switch 22 is open, and hence the voltage at one of the input terminals of the NOR gate 19 is high, the NOR gate 19 produces a low level signal. The source-to-drain impedance of the MOS-FET 24 in its conductive state should be lower than the output resistance of the NOR gate 19 when its output is at the low level.

When the Q output of the flip-flop 26 goes high, the transistor 24 is switched to the nonconducting state isolating the switch 22 from the logic circuit, while the voltage at the set terminal S of the flip-flop 25 on lead 34 remains low.

Under these conditions, the closure of switch 22 places a high level potential on lead 34 when the transistor 24 switches to the conducting state with the voltage on lead 32 being low. The high voltage on the set terminal of the flip-flop 25 couples a low voltage to the NOR gate 19, thus the Q output of the flip-flop 25 goes high. However, at the instant the voltage on lead 34 goes high, the output of the NOR gate 19 still remains low. Under these transient conditions, the voltage actually applied to the NOT gate 18 is determined by the ratio of the total impedance of the conducting impedance of the transistor 24 plus the output resistance of the NOR gate 19 to the output resistance of the NOR gate 19. Since the impedance of the transistor 24 is chosen at a low value compared to the output resistance of the NOR gate 19 as referred to above, the voltage at the input of the NOT gate 18 takes a value approximately the voltage H supplied from the voltage source through the switch 22.

With the Q output of the flip-flop 25 at the high voltage level, the Q output of the D flip-flop 28 goes high at the rising edge of a clock pulse supplied on lead 33 from the NOR gate 27. This high voltage on the Q output of the flip-flop 28 is transmitted by way of lead 35 to the timekeeping circuit or the like.

Figure 4:
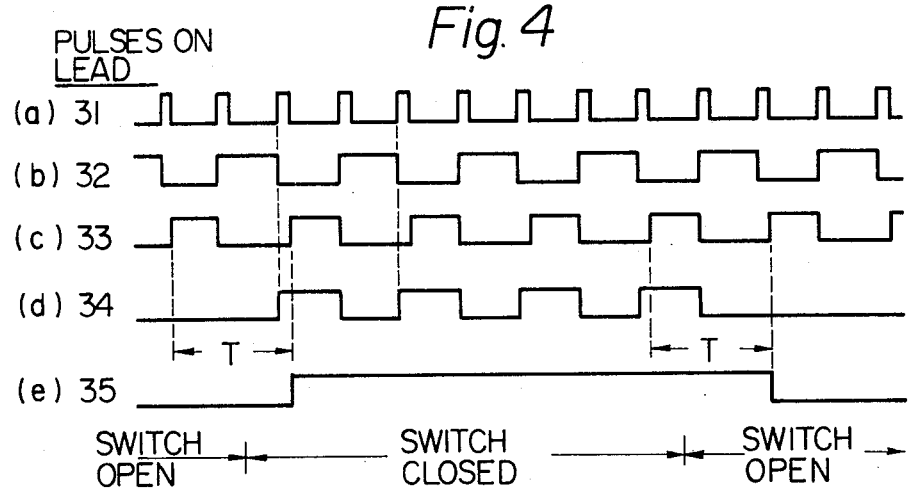
FIG. 4 is a waveform diagram useful for describing the operation of the circuit of FIG. 3.

Since the rising edges of the signal on lead 34 occur at the instant after the elapse of negligibly small interval from the instant the signal on lead 32 goes low, the rising or triggering edges of pulses on lead 33 appears within the active period of the pulses on lead 34 as illustrated in FIGS. 4c and 4d. Therefore, the input to the D input terminal of the flip-flop 28 is kept triggered by the clock pulses on lead 33 and thus, the output on lead 35 remains high as long as the switch 22 is closed as shown in FIG. 4e. Although the rising and falling edges of the pulse on the output lead 35 occur after the elapse of the maximum interval of T as indicated in FIG. 4, the delay interval of one repetition interval of the pulses on lead 33 is negligibly small as compared with the time involved in the manual operation of the switch 22.

Since the transistor 24 is conductive only when the signal on lead 32 is at the low voltage, there is no current flow from the high voltage source to the NOR gate 19 through the transistor 24 and thus the power dissipation during the on time of the switch 22 is reduced to minimum. Furthermore, due to the memory function of the flip-flop 28, the output pulse on lead 35 is not interfered by the possible chatterings on the contacts of the switch 22 provided that the output pulse on lead 33 has a frequency greater than the maximum duration of the chatterings.

Figure 5:
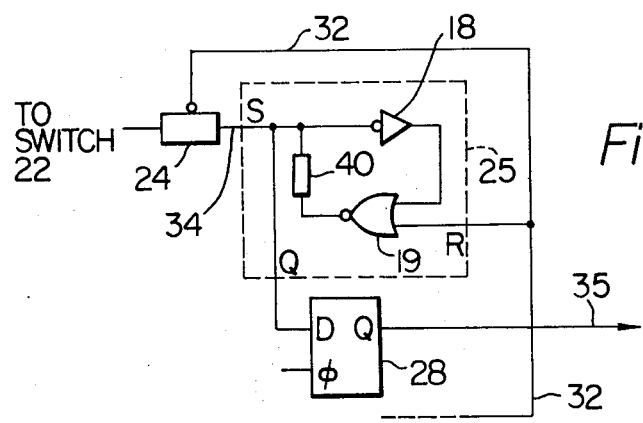
FIG. 5 is a circuit diagram of a modified form of the flip-flop circuit of the FIG. 3 circuit.

In order to ensure that with the switch 22 being closed, the set terminal of the flip-flop 25 is supplied with a voltage high enough to turn it on at the instant the transistor 24 is switched to the conductive state, a resister 40 is connected between the output of the NOR gate 19 and junction between the input of the NOT gate 18 and the output or drain electrode of the transistor 24, and the Q output of the flip-flop 25 is connected to the aforesaid junction point, as illustrated in FIG. 5. Let $R_1$, $R_2$ and $R_3$ represent the resistances of the conduction path of the transistor 24, the resistor 40 and the output resistance of the NOR gate 19, respectively, the voltage V applied to the set terminal of the flip-flop 25 is given as follows:

$$V = \frac{R_2 + R_3}{R_1 + R_2 + R_3} V_0$$

where $V_0$ is the voltage of the potential H delivered from the voltage source through the switch 22. With the resistor 40 so connected as shown, a substantial value of impedance can be tolerated of the conduction path of the transistor 24, if the resistance $R_2 + R_3$ is sufficiently greater than $R_1$. The relaxed tolerance in the value of the conduction impedance facilitates fabrication the MOS field effect transistor 24 on an integrated circuit chip.

Figure 6:
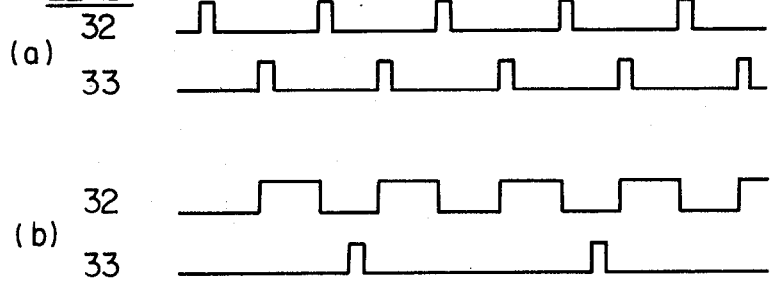
FIG. 6 is a waveform diagram showing the timing relations between clock and reset pulses.

As previously described, the rising or triggering edges of the clock pulses on lead 33 should occur within the inactive periods of the pulses on lead 34 at the D input terminal of the flip-flop 28 in order to provide an output pulse as long as the switch 22 is closed. So far as this requirement is met, other timing relations than that shown and described in connection with FIG. 3 are possible between the reset pulses on lead 32 and the clock pulses on lead 33 as shown in FIGS. 6a and 6b in which the triggering edges of the clock pulses on lead 33 occur during the inactive periods of the reset pulses on lead 32.

The foregoing description shows only preferred embodiments of the present invention. Various modifications are apparent to those skilled in the art without departing from the scope of the present invention which is only limited by the appended claims. Therefore, the embodiments shown and described are only illustrative, not restrictive.

What is claimed is:

1. In combination with a switch having a pair of contacts, one of which is connected to a voltage source:
   first means providing pulses having predetermined lengths of active and inactive periods;
   a solid state switching device responsive to the inactive period of the pulses to provide a conduction path;
   second means providing pulses, the triggering edges of which occurring within the inactive periods of the pulses from the first means;
   a flip-flop having a set input terminal connected to the other contact of the switch via the conduction path of the solid state switching device, a reset input terminal connected to the first means to reset the flip-flop during the active periods of the pulses therefrom; and
   a D flip-flop having a data input terminal connected to the output of the first mentioned flip-flop and a clock input terminal connected to the second means to trigger the D flip-flop at the triggering edges of the pulses therefrom.

2. The combination as claimed in claim 1, wherein the solid state switching device is an enhancement mode field effect transistor.

3. The combination as claimed in claim 1, wherein the first flip-flop comprises a NOT gate having its input connected to the solid state switching device and a NOR gate having one input connected to the output of the NOT gate and its output connected to the input of the NOT gate forming a closed memory loop, the input of the NOT gate being further connected to the data input terminal of the D flip-flop, and the other input of the NOR gate being connected to the first means.

4. The combination as claimed in claim 3, further comprising means for increasing the output resistance of the NOR gate.

5. The combination as claimed in claim 4, wherein said resistance increasing means comprises a resistor connected between the output of the NOR gate and the input of the NOT gate.

6. A solid state binary logic signal source for an electronic timepiece or the like, comprising in combination with a switch having normally open contacts, one of which is connected to a voltage source;
   a pulse generator providing a first train of pulses having predetermined lengths of active and inactive periods and a second train of pulses, the triggering edges of which occurring during the inactive periods of the first train of pulses;
   a solid state switching device responsive to the first train of pulses to provide a conduction path during the inactive periods of the pulses;
   a flip-flop comprising NOT and NOR gates, the input of the NOT gate being connected to the solid state switching device and the output thereof being connected to one input of the NOR gate, the output of the NOR gate being connected to the input of the NOT gate forming a closed memory loop, the other input of the NOR gate being connected to the pulse generator to receive said first train of pulses to reset the flip-flop during the active periods of the first train of pulses; and
   a D flip-flop having a data input terminal connected to the input of the NOT gate and a clock input terminal connected to the pulse generator to receive the second train of pulses to trigger the D flip-flop at the triggering edges of the second train pulses, and an output terminal being adapted to be connected to a circuit of the electronic timepiece or the like.

7. A solid state binary logic signal source as claimed in claim 6, wherein the pulse generator comprises a second D flip-flop having a data input terminal connected to one output terminal thereof, a clock input terminal being receptive of pulses at a constant repetition rate, and a second NOR gate having one input connected to the other output of the second D flip-flop and the other input thereof connected to the clock input terminal of the second D flip-flop, whereby the first train of pulses appears on the said other output terminal of the second D flip-flop and the second train of pulses appears on the output terminal of the second NOR gate.

8. A solid state binary logic signal source as claimed in claim 6, wherein said solid state switching device comprises a metal oxide semiconductor field effect transistor of the enhancement type.

* * * * *